(12) United States Patent
Kroneder

(10) Patent No.: US 7,741,711 B2
(45) Date of Patent: Jun. 22, 2010

(54) POWER SEMICONDUCTOR MODULE WITH A CONNECTED SUBSTRATE CARRIER AND PRODUCTION METHOD THEREFOR

(75) Inventor: Christian Kroneder, Schwanstetten (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 18 days.

(21) Appl. No.: 12/220,827

(22) Filed: Jul. 28, 2008

(65) Prior Publication Data
US 2009/0045500 A1 Feb. 19, 2009

(30) Foreign Application Priority Data
Jul. 26, 2007 (DE) .................. 10 2007 034 849

(51) Int. Cl.
*H01L 23/52* (2006.01)
(52) U.S. Cl. ............. 257/730; 257/732; 257/E21.001
(58) Field of Classification Search .............. 257/678, 257/773, 723, 730, 732, E21.575, E21.001, 257/E23.141, 692
See application file for complete search history.

(56) References Cited
FOREIGN PATENT DOCUMENTS
| | | |
|---|---|---|
| DE | 101 00 460 | 7/2002 |
| DE | 101 39 287 | 3/2003 |
| WO | WO 03/015167 | 2/2003 |

*Primary Examiner*—Roy K Potter
(74) *Attorney, Agent, or Firm*—Cohen Pontani Lieberman & Pavane LLP

(57) ABSTRACT

A power semiconductor module includes a housing, a substrate carrier with a circuit thereon and electrical connection elements extending therefrom. The carrier has a cutout between its inner surface (facing the interior of the module) and its outer surface. The cutout is smaller at the inner surface than at the outer surface. The housing has an extension that reaches into the cutout and may be deformed to form a riveted connection. The method comprises: forming a housing with at least one extension which extends towards the exterior of the module, wherein the extension projects through the cutout and beyond the outer surface of the carrier; and deforming the end of the extension so that it widens and forms a riveted connection and at the same time lies below the outer surface of the carrier.

7 Claims, 3 Drawing Sheets

POWER SEMICONDUCTOR MODULE WITH A CONNECTED SUBSTRATE CARRIER AND PRODUCTION METHOD THEREFOR

BACKGROUND OF THE INVENTION

1. Field of the Invention

The invention is directed to a power semiconductor module and, more particularly, to such a module having a housing, at least one substrate carrier, preferably arranged in a recess of the housing and laterally enclosed by the housing, with a power-electronics circuit arrangement constructed thereon and electrical terminal elements extending therefrom.

2. Description of the Related Art

By way of example, a power semiconductor module generally of the inventive type is disclosed in German Patent No. DE 101 00 460 A1 has long been known in its basic form. Such known power semiconductor modules have a substrate carrier which forms the lower termination of the power semiconductor module. The module includes a housing formed of insulating material and protrudes slightly above the substrate carrier on its longitudinal sides, thereby enclosing it. Such substrate carriers are frequently formed as a flat molded metal body, preferably of copper. This results in low thermal resistance with effective spreading of the heat for dissipating heat from the power-electronics circuit arrangement to a cooling component.

According to the prior art, it is also known that the substrate carrier is bonded to the housing in order to prevent the outflow of a liquid insulating material from the housing, when the housing is filled with such a liquid insulating material, for example a silicone rubber. Furthermore, the housing is connected to the substrate carrier by means of metallic rivet connections. These rivet connections are constructed as hollow bodies with a continuous recess in order to also enable the power semiconductor module to be attached to a cooling component by means of a screw connection. According to the prior art, these rivet connections are preferably made of brass since the lead component of the brass allows for a certain deformation.

On the substrate carrier itself, the circuit arrangement of the power semiconductor module is insulated from the carrier. In this context, various circuit arrangements with power transistors, power diodes and/or power thyristors are known. The circuit arrangement is insulated from the substrate carrier by insulating substrates, for example DCB (direct copper bonding) substrates.

Various types of connection elements for load and auxiliary connections, for example control connections for controlled power semiconductor components, are known. Various technologies for connecting these connection elements to the substrate or the power semiconductor components of the circuit arrangement are likewise known. Soldering connections, pressure contact connections and/or pressure sintering connections are particularly preferred.

What is disadvantageous about known power semiconductor modules is that the substrate carrier is connected to the housing both by an adhesive bond and a riveted connection, which ensures a secure connection but may also be complex to manufacture.

SUMMARY OF THE INVENTION

It is therefore an object of the invention to provide a power semiconductor module having a substrate carrier, wherein the substrate carrier is joined together with a housing of the power semiconductor module by means that are both cost-effective and automatable.

The inventive power semiconductor module includes a housing, at least one substrate carrier that is preferably disposed in a recess of the housing and is enclosed laterally, preferably on all sides, by the housing. A power electronic circuit from which electrical connection elements for load and auxiliary connections extend, is formed on the substrate carrier. The substrate carrier thus forms an outer side of the power semiconductor module that faces the cooling component or part of such an outer side of the power semiconductor module.

According to the invention, the substrate carrier has at least one continuous cutout reaching from the interior of the power semiconductor module towards the outside thereof. The clear width of the at least one cutout is smaller on its inner main surface facing the interior of the power semiconductor module than the clear width of its outer main surface facing the exterior of the power semiconductor module.

Furthermore, the housing has at least one extension which reaches into the cutout of the substrate carrier and the thickness of which increases in the interior of the substrate carrier from the inside towards the outside. As a result of this, the at least one extension forms a riveted connection with the substrate carrier.

The inventive method for producing such a power semiconductor module has the following steps:

forming a plastic housing with at least one pin-like extension which is directed towards the exterior of the power semiconductor module. The at least one extension is preferably disposed proximate to a cutout for a substrate carrier. The extension is formed so that it projects beyond the outer main surface of the substrate carrier after its formation;

preferably arranging at least one substrate carrier in an assigned cutout of the housing. The extension(s) is/are formed to reach through a respective cutout in the substrate carrier and project beyond the outer main surface of the substrate carrier; and deforming the end of the at least one extension in such a way that its end widens as a result, thereby forming a rivet connection. At the same time, the respective extension is thereby disposed within the surface formed by the outer main surface of the substrate carrier. This deformation is preferably effected by temperature and/or ultrasound.

It may be preferred for the assigned cutout of the substrate carrier to be closed up sufficiently tightly by the deformation of the extension, to allow the interior space of the power semiconductor module to be filled with a potting compound without the compound emerging in the region of the cutout.

It may furthermore be preferred if the substrate carrier is replaced in terms of its functionality by the substrate itself. In this case, the substrate forms the boundary of the power semiconductor module and, for its part, includes the necessary cutouts for the rivet connection.

It may be preferred if the housing includes an elastic seal preferably disposed circumferentially around the recess and directed towards the inner main surface of the substrate carrier.

The invention therefore provides a connection of the housing to at least one substrate carrier that is simple to produce. The riveted connection provided thereby is strong enough also to withstand the forces that are exerted on the substrate carrier if at least one of the connection elements is formed as a spring contact device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
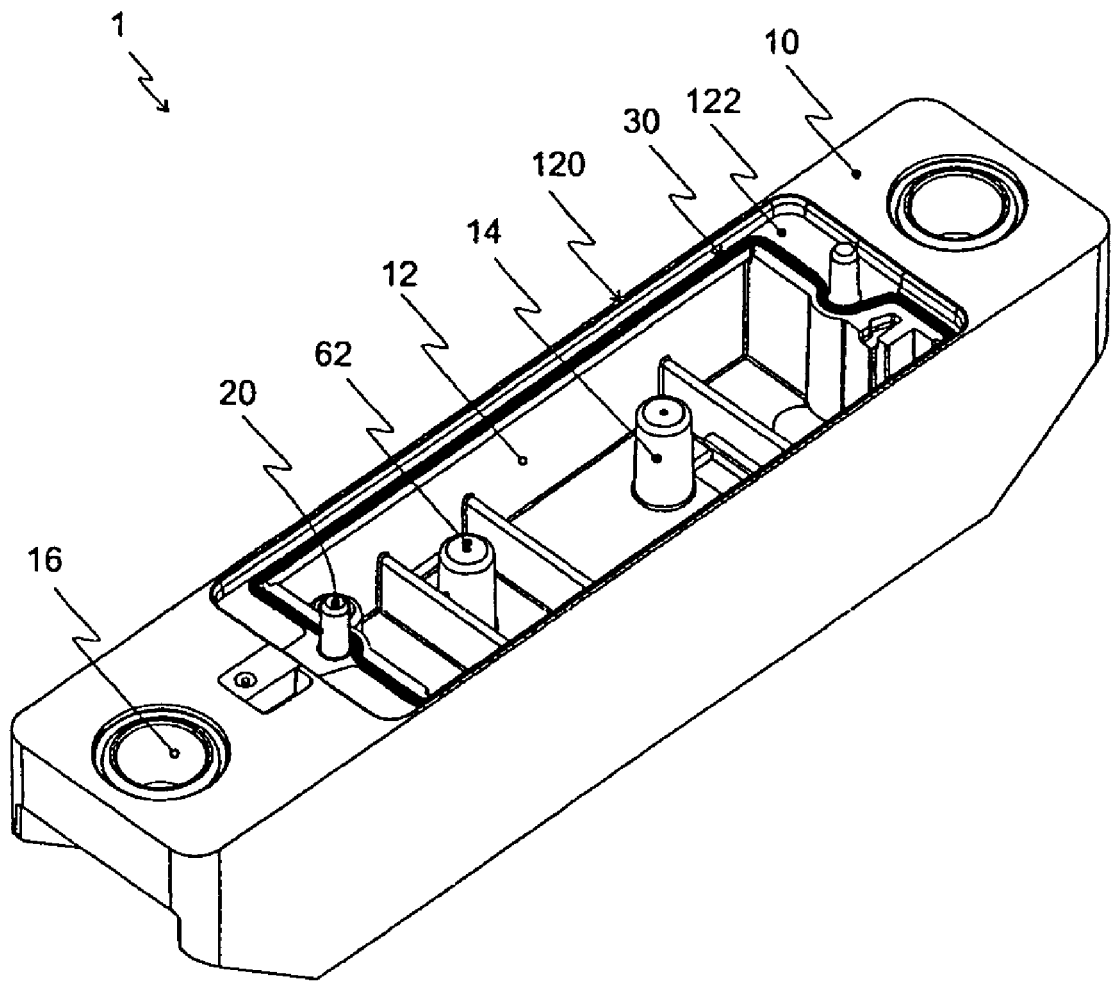
FIG. 1 is a perspective view of the housing of an inventive power semiconductor module without a substrate carrier.

FIG. 1 shows, generally at 1, a power semiconductor module in accordance with the invention. Module 1 has a housing 10, preferably formed of a plastic that is thermally stable to above 150° C., without a substrate carrier. On the side of housing 10 which faces a cooling device (not shown in FIG. 1), housing 10 has a recess 12 for receiving a substrate carrier, and also two bushings 16 for screw connections to the cooling device. In this case, recess 12 advantageously has a respective web 120 at the two longitudinal sides of power semiconductor 1, in order to enclose the substrate carrier on all sides.

Further bushings 14 for arranging connection elements, here auxiliary connection elements 62 formed as contact springs, are shown in the interior of power semiconductor module 1. Auxiliary connection elements 62 provide external connection to a circuit arrangement arranged on the substrate carrier that may be arranged in recess 12 of housing 10.

Housing 10 preferably has extensions 20 preferably formed integrally therewith, disposed in an edge region 122 of region 12. Extensions 20 are formed in pin-like fashion and project beyond housing 10 in the direction of the substrate carrier to be disposed thereon.

A sealing device 30 formed of an elastic plastic, which was preferably produced jointly with housing 10 in a two-component injection-molding method, is also shown. Sealing device 30 forms a circumferential sealing lip in edge region 122 of recess 12, which sealing lip preferably encloses extensions 20 in a suitable manner such that extensions 20 are disposed on the exterior of the sealing lip.

Figure 2:
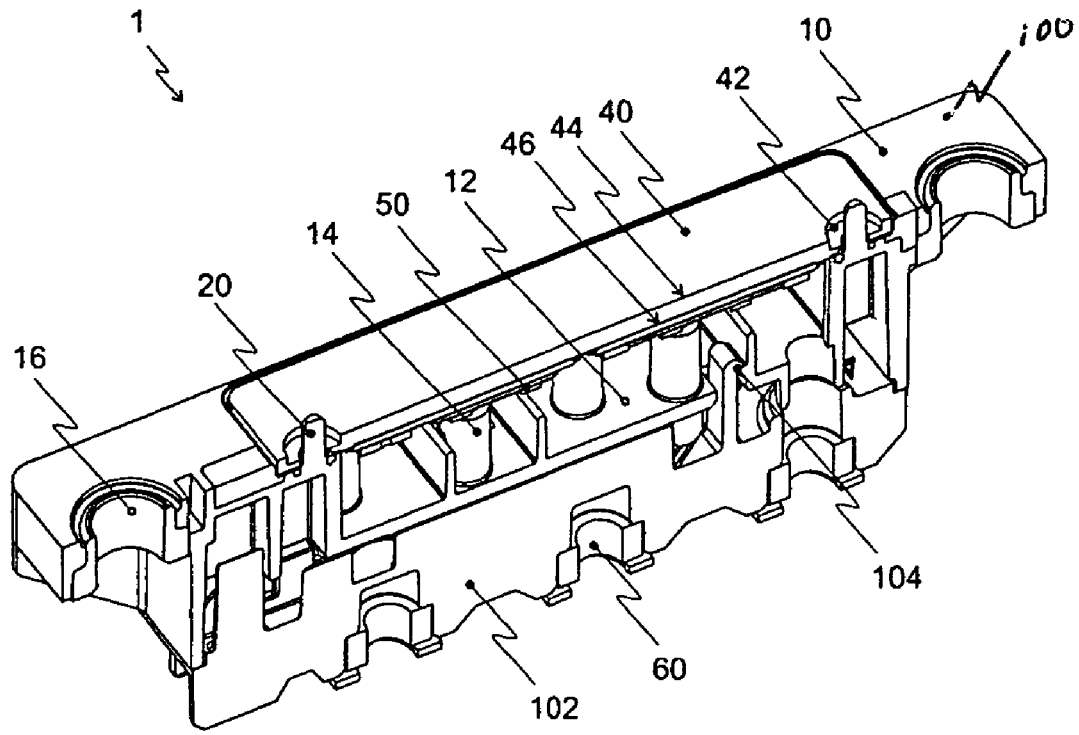
FIG. 2 is a longitudinal section through the inventive housing with a substrate carrier attached thereto.

FIG. 2 shows a longitudinal section of housing 10 in accordance with FIG. 1 with a substrate carrier 40 arranged thereon. Substrate carrier 40 is preferably formed as a surface-refined copper plate. Substrate carrier 40 has continuous cutouts 42 aligned with extensions 20. Cutouts 42 are tapered from the interior of power semiconductor module 1 towards its exterior, wherein their clear width on an inner main surface 46 facing the interior of power semiconductor module 1 is smaller than their clear width on an outer main surface 44 facing the exterior of power semiconductor module 1.

The illustration furthermore shows a power electronic circuit arrangement 50, which is arranged on substrate carrier 40 in an electrically insulated manner. Load and auxiliary connection elements 60 for the external connection of power semiconductor module 1 extend therefrom. The illustration likewise shows the two-part embodiment of housing 10 with a base housing 100, which also includes extension 20 and a cover 102, wherein the two are connected to one another by means of a snap-fit connection 104.

Figure 3:
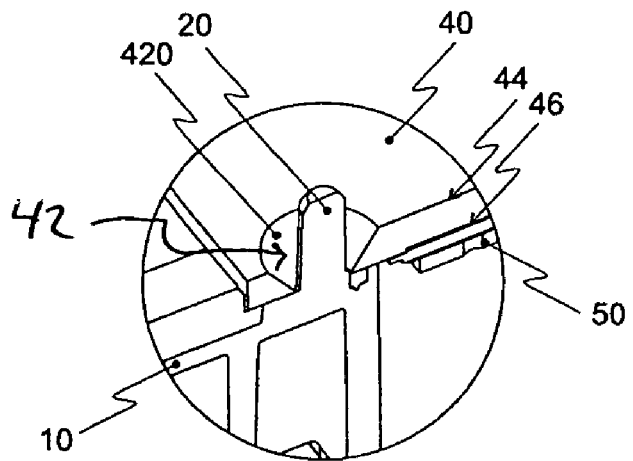
FIG. 3 is a detail of the inventive power semiconductor module of FIG. 2.

FIG. 3 shows a detail of a power semiconductor module 1 according to the invention, wherein housing 10 and substrate carrier 20 are connected. Here, the illustration shows the substrate carrier 40 with a circuit arrangement 50 arranged thereon and housing 10 with an extension 20 prior to the deformation thereof by means of the method according to the invention.

Cutout 42 of the substrate carrier, said cutout being aligned with extension 20 of housing 10, is formed in the shape of a truncated cone with the base of the truncated cone 420 at the outer main surface 44 of the substrate carrier 40.

Figure 4:
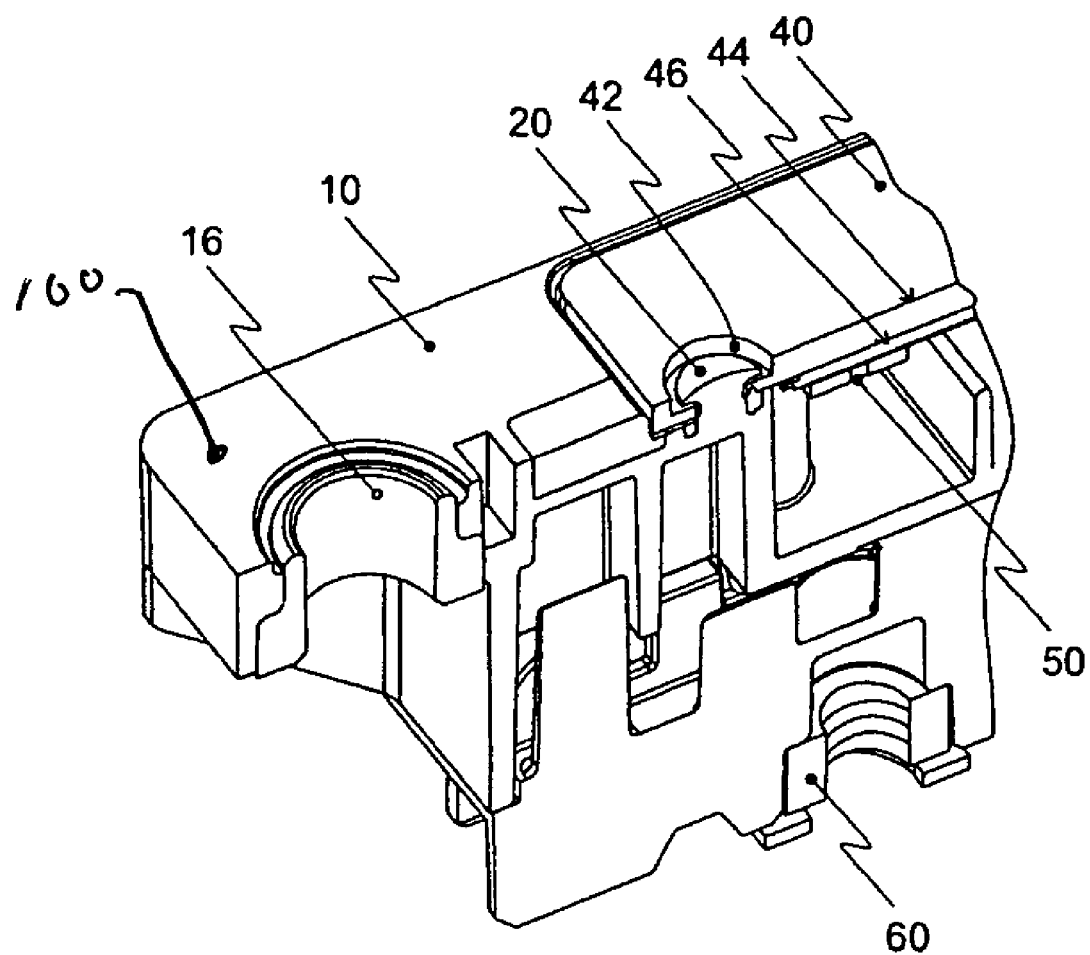
FIG. 4 a detail of the inventive power semiconductor module, wherein the housing and substrate carrier are connected to one another.

For the secure connection of housing 10 to substrate carrier 40, extensions 20 of housing 10 are deformed by applying temperature and/or ultrasound thereto in such a way that, as shown in FIG. 4, they no longer project beyond the outer main surface 44 of substrate carrier 40. By forming cutouts 42 as described, cutouts 42 can receive the volume of deformed extensions 20 completely therein. By virtue of the outwardly increasing diameter of cutouts 42, which are preferably made round, a rivet-like connection is thus formed between housing 10 and substrate carrier 40.

It is advantageous here if substrate carrier 40 projects slightly beyond housing 10 at its outer main surface 44 in the direction of a cooling component so that substrate carrier 40 can attain a whole-area contact with the cooling component.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a housing; and
   at least one substrate carrier with a circuit arrangement formed thereon and electrical connection elements extending from said circuit arrangement;
   wherein said at least one substrate carrier has at least one continuous cutout which reaches from an inner main surface thereof, which inner surface faces the interior of the power semiconductor module to an outer main surface of said substrate carrier and the clear width of which cutout, at its inner main surface, is smaller than its clear width on its outer main surface; and
   wherein said housing has, in the region of said substrate carrier, at least one extension which extends into a respective cutout in said at least one substrate carrier and is capable of forming a riveted connection therewith.

2. The power semiconductor module of claim 1,
wherein said substrate carrier is formed as a surface-refined copper plate, and arranged on said inner main surface thereof is a power electronic circuit arrangement that is electrically insulated from said copper plate.

3. The power semiconductor module of claim 1,
wherein said substrate carrier is arranged in a recess of said housing and is laterally enclosed thereby.

4. The power semiconductor module of claim 1,
wherein said riveted connection of said housing to said substrate carrier is formed so that said cutout is closed off sufficiently tightly to prevent the substantial outflowing of the interior space of the power semiconductor module with a potting compound.

5. The power semiconductor module of claim 1,
wherein said extension is formed integrally with said housing and said recess has an elastic seal formed circumferentially and in a direction towards said inner main surface of said substrate carrier.

6. The power semiconductor module of claim 1,
wherein at least one said electrical connection element is a spring contact device.

7. The power semiconductor module of claim 1,
wherein said cutout is formed in the shape of a truncated cone with its base at said outer main surface.

* * * * *